(12) United States Patent
Maeda et al.

(10) Patent No.: US 10,096,492 B2
(45) Date of Patent: Oct. 9, 2018

(54) SUBSTRATE CLEANING APPARATUS AND POLISHING APPARATUS

(71) Applicant: EBARA CORPORATION, Tokyo (JP)

(72) Inventors: Koji Maeda, Tokyo (JP); Hiroshi Shimomoto, Tokyo (JP); Hisajiro Nakano, Tokyo (JP)

(73) Assignee: EBARA CORPORATION, Tokyo (JP)

( * ) Notice: Subject to any disclaimer, the term of this patent is extended or adjusted under 35 U.S.C. 154(b) by 111 days.

(21) Appl. No.: 14/043,419

(22) Filed: Oct. 1, 2013

(65) Prior Publication Data

US 2014/0190530 A1    Jul. 10, 2014

(30) Foreign Application Priority Data

Oct. 3, 2012  (JP) ................. 2012-221488

(51) Int. Cl.
  *A47L 15/42*  (2006.01)
  *H01L 21/67*  (2006.01)
(52) U.S. Cl.
  CPC .............. *H01L 21/67051* (2013.01)
(58) Field of Classification Search
  CPC ......... H01L 21/67051; H01L 21/67046; H01L 21/68721; H01L 21/68728; H01L 21/304; H01L 21/30625; H01L 21/6719; H01L 21/67219; H01L 21/67017; H01L 21/67207; H01L 21/02041; H01L 21/02054; H01L 21/6715; G01N 21/9501; B05C 21/00; B05C 3/02; B05C 5/02; B08B 1/002; B08B 1/04; B08B 3/04; B08B 3/14; B25J 9/042
  USPC ... 134/33, 56 R, 103.3, 104.1, 157, 199, 36; 418/9, 95; 118/52, 70; 15/3, 302, 88.3, 15/97.1; 198/470.1
  See application file for complete search history.

(56) References Cited

U.S. PATENT DOCUMENTS 5,078,832 A * 1/1992 Tanaka ............ H01L 21/31111
                                             134/1
6,197,123 B1 * 3/2001 Poag et al. ................. 134/18
6,358,128 B1 * 3/2002 Sakurai et al. ............. 451/67
(Continued)

FOREIGN PATENT DOCUMENTS

CN        101797714 A    8/2010
JP        H10-172945 A   6/1998
(Continued)

OTHER PUBLICATIONS

English Translation of Japanese Office action issued in Patent Application No. JP-2012-221488 dated Nov. 15, 2017.

*Primary Examiner* — Michael E Barr
*Assistant Examiner* — Tinsae B Ayalew
(74) *Attorney, Agent, or Firm* — Pearne & Gordon LLP

(57) ABSTRACT

A substrate cleaning apparatus capable of preventing a cleaning vessel from being corroded by a chemical liquid while constituting the cleaning vessel with a low-price material is provided. The substrate cleaning apparatus includes: a cleaning vessel for holding a substrate therein; a substrate holder arranged in the cleaning vessel; a chemical liquid nozzle for supplying a chemical liquid onto the substrate held by the substrate holder; and a plurality of cleaning liquid nozzles for supplying a cleaning liquid onto an inner surface of the cleaning vessel. The inner surface of the cleaning vessel has been subjected to a hydrophilization treatment.

20 Claims, 9 Drawing Sheets

(56) References Cited

U.S. PATENT DOCUMENTS

| | | | |
|---|---|---|---|
| 6,447,853 B1* | 9/2002 | Suzuki et al. | 427/585 |
| 2002/0028288 A1* | 3/2002 | Rohrbaugh | B01J 39/043 |
| | | | 427/180 |
| 2004/0065352 A1 | 4/2004 | Yonekura et al. | |
| 2005/0072358 A1* | 4/2005 | Katsuoka | C23C 18/1628 |
| | | | 118/719 |
| 2006/0048792 A1* | 3/2006 | Nakamura | B08B 3/02 |
| | | | 134/2 |
| 2007/0277930 A1* | 12/2007 | Yokoyama | H01L 21/67051 |
| | | | 156/345.31 |
| 2008/0000509 A1* | 1/2008 | Yonekura | B08B 3/02 |
| | | | 134/166 R |
| 2008/0038448 A1* | 2/2008 | Kholodenko | H01L 21/67051 |
| | | | 118/696 |
| 2008/0105653 A1* | 5/2008 | Seah | H01L 21/67028 |
| | | | 216/92 |
| 2011/0031326 A1* | 2/2011 | Sato | H01L 21/02057 |
| | | | 239/1 |
| 2011/0139188 A1* | 6/2011 | Tsai | B08B 3/02 |
| | | | 134/26 |
| 2011/0139907 A1* | 6/2011 | Lutz et al. | 239/589.1 |

FOREIGN PATENT DOCUMENTS

| | | |
|---|---|---|
| JP | 11-297652 A | 10/1999 |
| JP | H11-330039 A | 11/1999 |
| JP | 2000-188272 A | 7/2000 |
| JP | 2004-047714 A | 2/2004 |
| JP | 2004-079793 A | 3/2004 |
| JP | 2005-032915 A | 2/2005 |
| JP | 2006-066501 A | 3/2006 |
| JP | 2006-114884 A | 4/2006 |
| JP | 2010-157528 A | 7/2010 |
| JP | 2010-238850 A | 10/2010 |
| JP | 2011-181588 A | 9/2011 |
| JP | 2012-015348 A | 1/2012 |
| WO | 2007/108315 A1 | 9/2007 |

* cited by examiner

SUBSTRATE CLEANING APPARATUS AND POLISHING APPARATUS

CROSS REFERENCE TO RELATED APPLICATIONS

This application claims priority to Japanese Patent Application No. 2012-221488 filed Oct. 3, 2012, the entire contents of which are hereby incorporated by reference.

BACKGROUND OF THE INVENTION

Field of the Invention

The present invention relates to a substrate cleaning apparatus for cleaning a substrate, such as a wafer, and more particularly to a substrate cleaning apparatus having a cleaning vessel for cleaning a substrate. The present invention also relates to a polishing apparatus provided with such a substrate cleaning apparatus.

Description of the Related Art

A polishing apparatus, which is typified by a CMP (chemical mechanical polishing) apparatus, polishes a surface of a wafer by providing sliding contact between the wafer and a polishing pad while supplying a polishing liquid (i.e., slurry) onto the polishing pad. The polishing liquid, which contains abrasive grains therein, and polishing debris remain on the polished surface of the wafer. Thus, after polishing of the wafer, cleaning of the polished wafer is performed.

There is an apparatus for cleaning a wafer by supplying a chemical liquid onto the wafer in a cleaning vessel. This type of cleaning apparatus is configured to supply the chemical liquid, which has an etching action, onto a surface of the wafer to thereby remove foreign matters that are attached to the wafer. Recently, in order to enhance the etching action, a high-temperature chemical liquid having a temperature of around 80° C. may be used. The use of such a chemical liquid having a strong etching action makes it possible to remove the foreign matters which could not be removed by a conventional chemical liquid.

However, the use of the chemical liquid having the strong etching action may corrode the cleaning vessel of the cleaning apparatus. The corrosion of the cleaning vessel due to the chemical liquid can be prevented if a material with high corrosion resistance is used to constitute the cleaning vessel. However, such a material having high corrosion resistance is expensive, and therefore use of such a material increases costs of the cleaning apparatus as a whole.

SUMMARY OF THE INVENTION

The present invention has been made in view of the above drawbacks. It is therefore an object of the present invention to provide a substrate cleaning apparatus capable of preventing a cleaning vessel from being corroded by a chemical liquid while constituting the cleaning vessel with a low-price material.

Further, it is an object of the present invention to provide a polishing apparatus provided with such a substrate cleaning apparatus.

A first aspect of the present invention for achieving the above object provides a substrate cleaning apparatus including: a cleaning vessel for holding a substrate therein; a substrate holder arranged in the cleaning vessel; a chemical liquid nozzle for supplying a chemical liquid onto the substrate held by the substrate holder; and a plurality of cleaning liquid nozzles for supplying a cleaning liquid onto an inner surface of the cleaning vessel. The inner surface of the cleaning vessel has been subjected to a hydrophilization treatment.

A second aspect of the present invention provides a substrate cleaning apparatus including: a cleaning vessel for holding a substrate therein; a substrate holder arranged in the cleaning vessel; a chemical liquid nozzle for supplying a chemical liquid onto the substrate held by the substrate holder; a plurality of cleaning liquid nozzles for supplying a cleaning liquid onto an inner surface of the cleaning vessel; and an oscillation mechanism for causing the plurality of cleaning liquid nozzles to oscillate.

A third aspect of the present invention provides a polishing apparatus including: a polishing section for polishing a substrate; and the substrate cleaning apparatus for cleaning the polished substrate.

According to the present invention, the cleaning liquid can be supplied onto an entire region, to be cleaned, on the inner surface of the cleaning vessel. Therefore, the cleaning liquid can prevent the chemical liquid from contacting the cleaning vessel and can therefore protect the cleaning vessel from the chemical liquid.

DETAILED DESCRIPTION OF THE PREFERRED EMBODIMENTS

Figure 1:
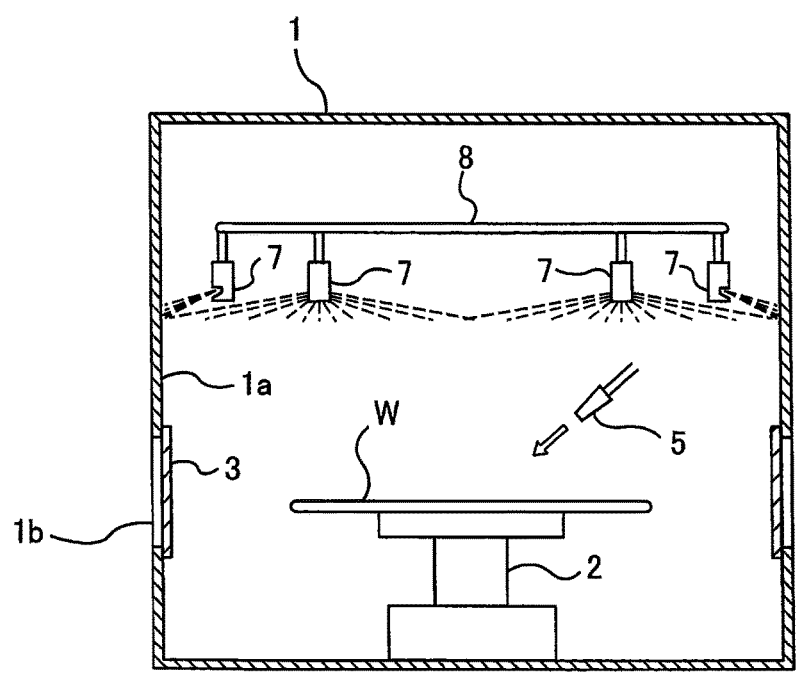
FIG. 1 is a schematic view showing a first embodiment of a substrate cleaning apparatus according to the present invention.

Embodiments of a substrate cleaning apparatus according to the present invention will be described below with reference to the drawings. FIG. 1 is a schematic view showing a first embodiment of the substrate cleaning apparatus according to the present invention. In FIG. 1, a wafer is depicted as a substrate. As shown in FIG. 1, the substrate cleaning apparatus has a cleaning vessel 1 for housing a wafer W therein, a substrate holder 2 provided in the cleaning vessel 1 and configured to hold the wafer W, a chemical liquid nozzle 5 arranged above the wafer W held by the substrate holder 2, and a plurality of cleaning liquid nozzles 7 for supplying a cleaning liquid onto an inner surface 1a of the cleaning vessel 1. The substrate holder 2 is configured to hold the wafer W horizontally by a vacuum suction and rotate the wafer W in a horizontal plane.

The chemical liquid nozzle 5 supplies a chemical liquid onto an upper surface of the rotating wafer W to thereby etch the wafer W. Examples of the chemical liquid to be used include an acid solution, such as sulfuric acid, and an alkaline solution, such as ammonia. In order to accelerate the etching action, a high-temperature chemical liquid may be used. For example, a chemical liquid ranging from an ordinary temperature to 100° C. may be used.

Figure 2:
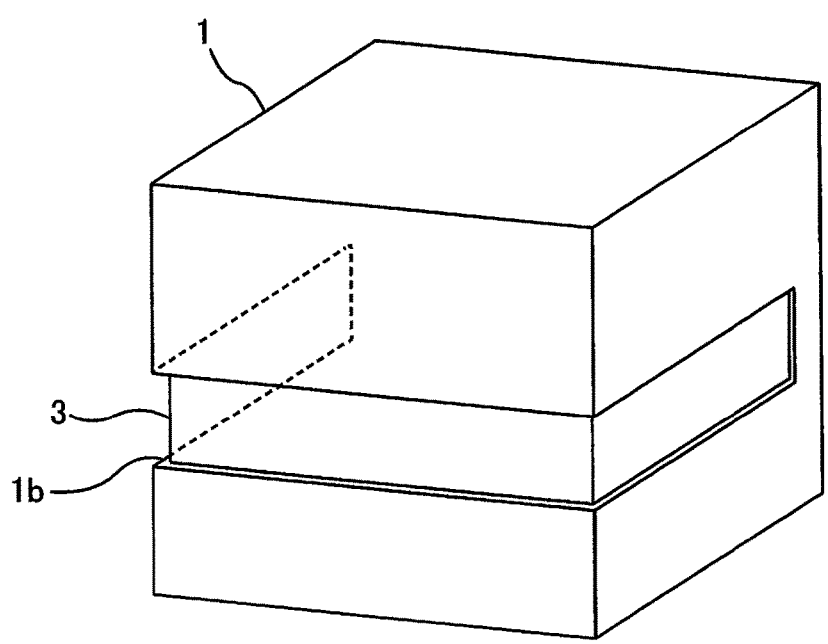
FIG. 2 is a perspective view showing a cleaning vessel.

FIG. 2 is a perspective view showing the cleaning vessel 1. This cleaning vessel 1 is a closed vessel constituted by an inexpensive synthetic resin, such as PVC (polyvinyl chloride). The cleaning vessel 1 has a bottom provided with a drain (not shown) for discharging the chemical liquid and the cleaning liquid. The cleaning vessel 1 further has an opening 1b through which the wafer W is carried into and out of the cleaning vessel 1. This opening 1b is in a form of a horizontally-extending cutout formed in three side surfaces of the cleaning vessel 1. A shutter 3 is provided for closing the opening 1b. The wafer W is carried horizontally into the cleaning vessel 1 through the opening 1b by a hand of a transfer robot (not shown), and placed onto the substrate holder 2. Then the etching process of the wafer W is performed by the chemical liquid in the cleaning vessel 1. During the chemical processing of the wafer W, the opening 1b is closed with the shutter 3. After the chemical processing, the wafer W is carried horizontally out of the cleaning vessel 1 through the opening 1b by the hand of the above-described transfer robot.

During the chemical processing, the wafer W is rotated by the substrate holder 2. As a result, the chemical liquid is scattered around the wafer W by a centrifugal force. If the chemical liquid is attached to the inner surface 1a of the cleaning vessel 1, the cleaning vessel 1 may be corroded. Thus, in order to protect the cleaning vessel 1 from the chemical liquid, the cleaning liquid is supplied from the cleaning liquid nozzles 7 to the inner surface 1a of the cleaning vessel 1 so as to form a film of the cleaning liquid on the inner surface 1a, while the chemical liquid is supplied onto the wafer W. The cleaning liquid nozzles 7 are located above the wafer W held by the substrate holder 2.

Figure 3:
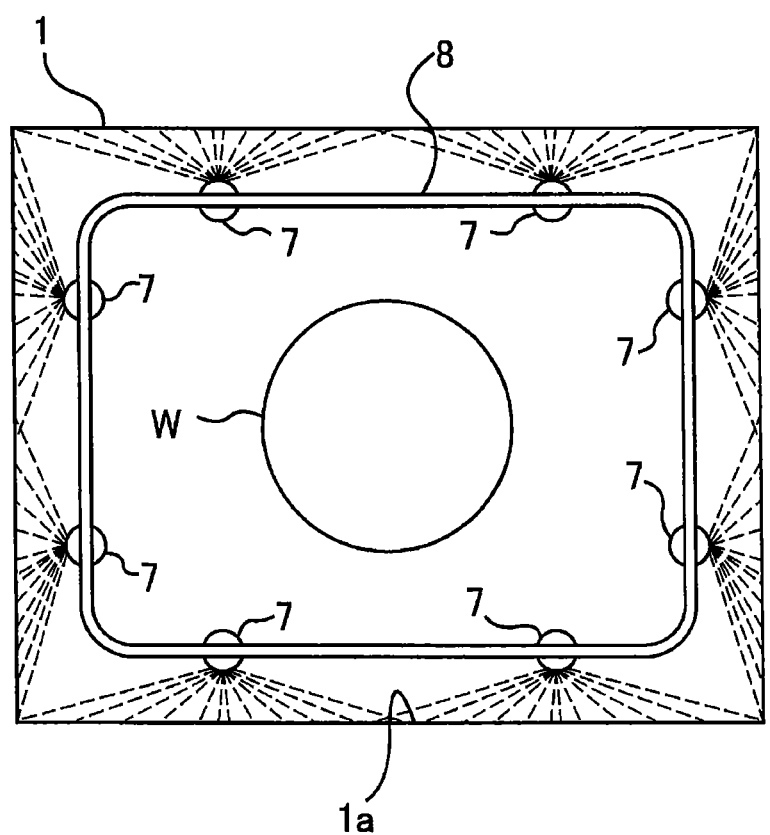
FIG. 3 is a plan view of the substrate cleaning apparatus shown in FIG. 1.

FIG. 3 is a plan view of the substrate cleaning apparatus. As shown in FIG. 3, the cleaning liquid nozzles 7 are arranged along an entire circumference of the wafer W. As viewed from above the wafer W, the cleaning liquid nozzles 7 are preferably arranged at approximately equal intervals along the circumference of the wafer W. Each cleaning liquid nozzle 7 faces toward the inner surface 1a of the cleaning vessel 1 so as to supply the cleaning liquid onto the inner surface 1a of the cleaning vessel 1. This inner surface 1a of the cleaning vessel 1 is constituted by a front surface, a back surface, and two side surfaces. At least one cleaning liquid nozzle 7, preferably plural cleaning liquid nozzles 7, is disposed for each surface. In the embodiment shown in FIG. 3, two cleaning liquid nozzles 7 are disposed for each of the front surface, the back surface, and the two side surfaces. However, it should be noted that the present invention is not limited to this embodiment. For example, three or more cleaning liquid nozzles 7 may be provided for each surface.

The cleaning liquid nozzles 7 are coupled to an annular connection pipe 8. The cleaning liquid nozzles 7 are further coupled to a cleaning liquid supply unit (not shown) through the connection pipe 8, so that the cleaning liquid is supplied to each one of the cleaning liquid nozzles 7 from the cleaning liquid supply unit. Examples of the cleaning liquid to be used include pure water. Each cleaning liquid nozzle 7 is shaped so as to diffuse the cleaning liquid toward the inner surface 1a of the cleaning vessel 1 to form a wide-angle spray in a fan shape. Therefore, each of the cleaning liquid nozzles 7 can supply the cleaning liquid over a wide region on the inner surface 1a of the cleaning vessel 1.

The cleaning liquid spreads in a fan shape from the cleaning liquid nozzle 7 to reach the inner surface 1a of the cleaning vessel 1. The cleaning liquid flows downwardly on the inner surface 1a of the cleaning vessel 1 to form a liquid film on the inner surface 1a. If the inner surface 1a of the cleaning vessel 1 is hydrophobic, a gap may be formed in the film of the cleaning liquid, or the liquid film may be broken. In such cases, the exposed inner surface 1a of the cleaning vessel 1 may be corroded by the chemical liquid. Thus, in order to form a uniform liquid film, the inner surface 1a of the cleaning vessel 1a has been subjected to a hydrophilization treatment in advance. The hydrophilic inner surface 1a allows formation of a uniform film of the cleaning liquid with no gap on the inner surface 1a. Therefore, the film of the cleaning liquid can protect the cleaning vessel 1 from the chemical liquid.

Examples of the hydrophilization treatment performed on the inner surface 1a of the cleaning vessel 1 include a wet blasting process in which slurry, containing abrasive grains in a liquid, is ejected toward a surface to be treated to thereby roughen the surface, a surface roughening process with use of a file or the like, a plasma surface modification, an application of a coating material of glass fiber (coating film), a formation of a titanium oxide film using a plasma CVD method, a process of coating a surface with superhydrophilic material, such as a photocatalytic thin film of titanium oxide ($TiO_2$), followed by a ultraviolet irradiation, and a surface roughening process by sand blasting using fine particles, such as SiC particles, followed by a formation of hydrophilic coating film ($SiO_2$ or a semiconductor interlayer dielectric). The semiconductor interlayer dielectric may be SOG (a coating glass: Spin on Glass). The hydrophilic coating film may be formed by spray-coating a roughened surface with a coating material containing perhydropolysilazane (PHPS), followed by drying the coating material. NAX 120-20 (manufactured by AZ Electronic Materials), for example, may preferably be used as the PHPS-based coating material.

The multiple cleaning liquid nozzles 7 are arranged so as to surround the entire circumference of the wafer W as viewed from above the wafer W. Therefore, the cleaning liquid, which has been supplied from the cleaning liquid nozzles 7 to the hydrophilic inner surface 1a, forms the film that surrounds the entire circumference of the wafer W held by the substrate holder 2 in the cleaning vessel 1. This film of the cleaning liquid can protect the cleaning vessel 1 from the chemical liquid that has been spun off from the wafer W or that has bounced off the wafer W.

Figure 4:
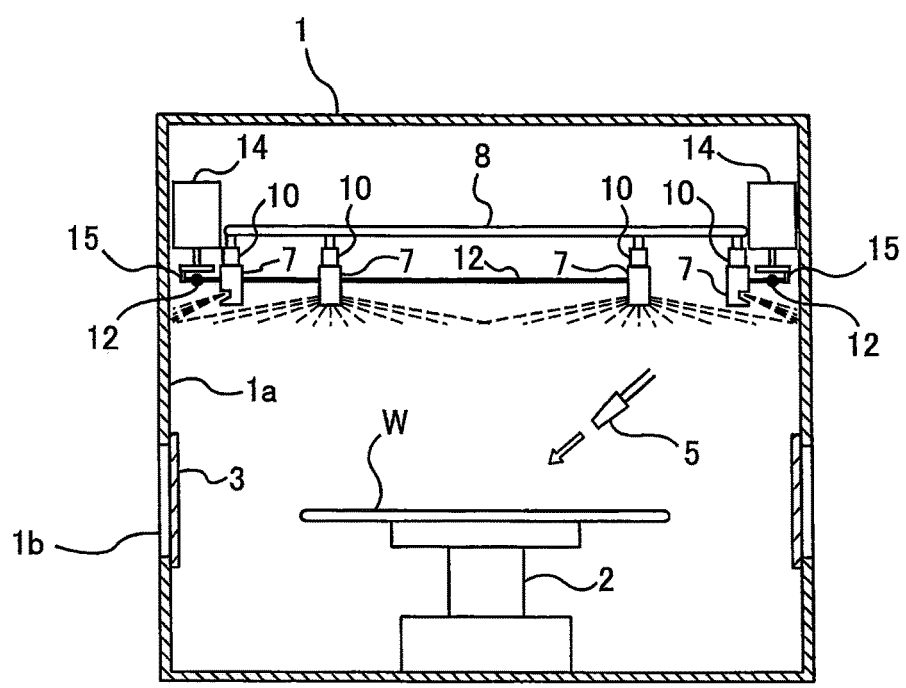
FIG. 4 is a view showing a second embodiment of the substrate cleaning apparatus according to the present invention.
Figure 5:
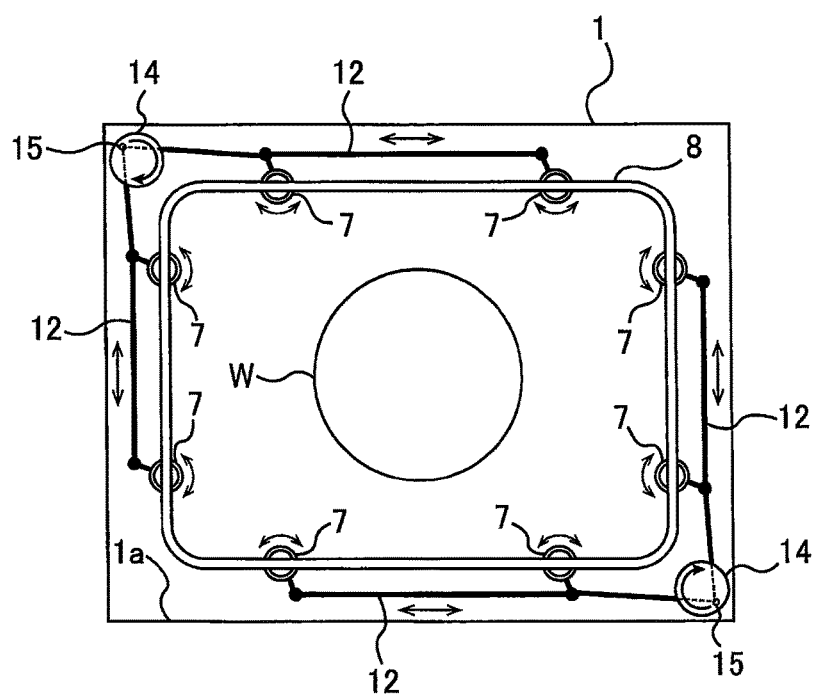
FIG. 5 is a plan view of the substrate cleaning apparatus shown in FIG. 4.

FIG. 4 is a schematic view showing a second embodiment of the substrate cleaning apparatus according to the present invention, and FIG. 5 is a plan view of the substrate cleaning apparatus shown in FIG. 4. Elements identical to those of the above-discussed first embodiment are denoted by the same reference numerals, and their repetitive descriptions are omitted.

In the second embodiment, the inner surface 1a of the cleaning vessel 1 is not subjected to the hydrophilization treatment. Instead, in order to ensure the supply of the cleaning liquid to the region to be cleaned, each of the cleaning liquid nozzles 7 is configured to oscillate horizontally. More specifically, each cleaning liquid nozzle 7 is rotatably supported by a rotary joint 10, which is coupled to the connection pipe 8. Each cleaning liquid nozzle 7 is further coupled to an eccentric shaft 15 of a motor 14 through a linkage 12. The eccentric shaft 15 may be a crank. When the eccentric shaft 15 of the motor 14 rotates, the linkage 12, which is coupled to the eccentric shaft 15, oscillates to cause the cleaning liquid nozzle 7 to rotate about a vertical axis through a predetermined angle in a clockwise direction and a counterclockwise direction alternately. In this manner, the rotation of the eccentric shaft 15 of the motor 14 causes the cleaning liquid nozzles 7 to oscillate (i.e., swing or pivot) in synchronization with each other.

In this embodiment, an oscillation mechanism for causing the cleaning liquid nozzles 7 to oscillate is constituted by four linkages 12 and two motors 14. Each of the cleaning liquid nozzles 7 is coupled to one of the four linkages 12. Two of the four linkages 12 are coupled to one of the two motors 14, and the other two linkages 12 are coupled to the other motor 14. However, the present invention is not limited to this embodiment. For example, a single motor 14 may be used to cause the four linkages 12 to oscillate. Further, instead of the motor 14, a pneumatic cylinder may be used as an actuator for making the movement of the linkages 12.

Figure 6:
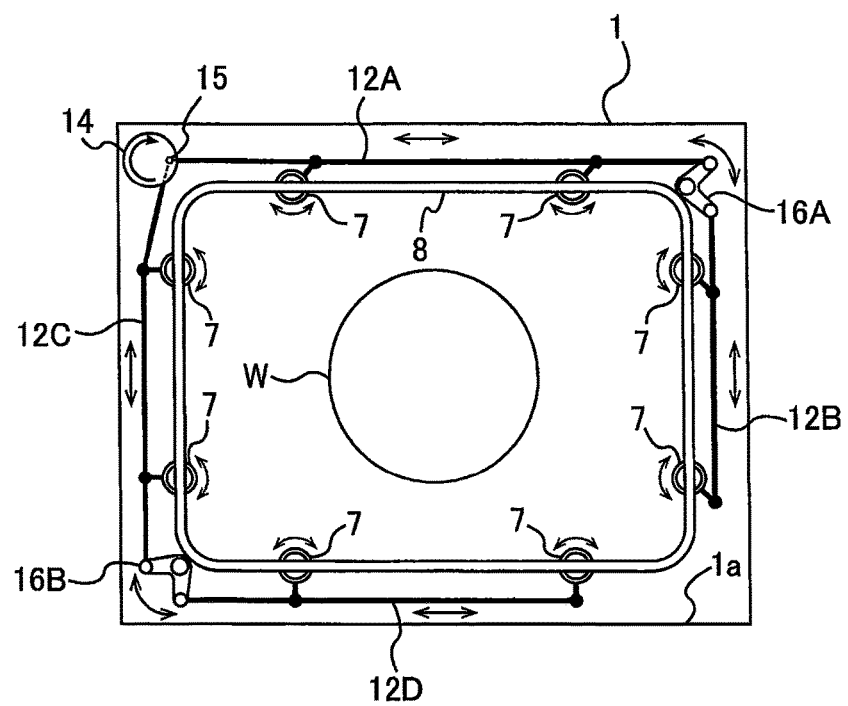
FIG. 6 is a plan view showing a modified example of the substrate cleaning apparatus shown in FIG. 5.

FIG. 6 is a plan view showing an example in which one motor is used to force the four linkages to oscillate. As shown in FIG. 6, one end of a linkage 12A is coupled to the eccentric shaft 15 of the motor 14, and the other end of the linkage 12A is coupled to other linkage 12B through an intermediate link 16A. Similarly, one end of a linkage 12C is coupled to the eccentric shaft 15 of the motor 14, and the other end of the linkage 12C is coupled to other linkage 12D through an intermediate link 16B. With these structures, as the eccentric shaft 15 of the motor 14 rotates, the four linkages 12A to 12D oscillate to cause the cleaning liquid nozzles 7, which are coupled to the linkages 12A to 12D, to oscillate (i.e., swing or pivot) in synchronization with each other.

Figure 7:
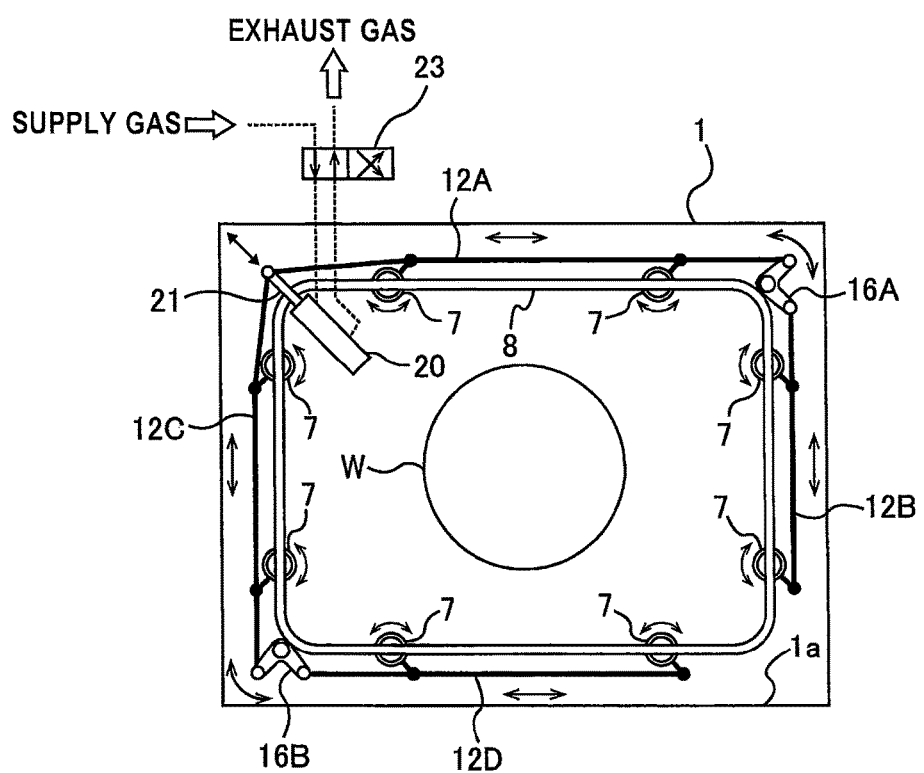
FIG. 7 is a plan view showing another modified example of the substrate cleaning apparatus shown in FIG. 5.

FIG. 7 is a plan view showing an example in which one pneumatic cylinder is used to force the four linkages to oscillate. As shown in FIG. 7, one end of a linkage 12A is coupled to a piston rod 21 of a pneumatic cylinder 20, and the other end of the linkage 12A is coupled to other linkage 12B through an intermediate link 16A. Similarly, one end of a linkage 12C is coupled to the piston rod 21 of the pneumatic cylinder 20, and the other end of the linkage 12C is coupled to other linkage 12D through an intermediate link 16B. An electromagnetic valve 23 is coupled to the pneumatic cylinder 20 so that a gas (typically air) is supplied through the electromagnetic valve 23 into the pneumatic cylinder 20. Specifically, the gas is supplied alternately into two operating chambers (not shown) on both sides of a piston (not shown) in the pneumatic cylinder 20. With these structures, as the electromagnetic valve 23 is switched from one position to another, the piston rod 21 of the pneumatic cylinder 20 reciprocates as indicated by arrow shown in FIG. 7 to cause the four linkages 12A to 12D, which are coupled to the piston rod 21, to oscillate. The oscillation of the linkages 12A to 12D further causes the cleaning liquid nozzles 7, which are coupled to the linkages 12A to 12D, to oscillate (i.e., swing or pivot) in synchronization with each other.

According to the embodiments shown in FIG. 5 through FIG. 7, the cleaning liquid is supplied from the oscillating cleaning liquid nozzles 7 onto the inner surface 1a of the cleaning vessel 1. Therefore, the cleaning liquid can be supplied onto an entire region, to be cleaned, on the inner surface 1a of the cleaning vessel 1 to wash away the chemical liquid from the cleaning vessel 1.

As with the first embodiment, the inner surface 1a of the cleaning vessel 1 may have been subjected to the hydrophilization treatment. The hydrophilic inner surface 1a and the oscillation of the cleaning liquid nozzles 7 can more reliably protect the cleaning vessel 1 from the chemical liquid.

Figure 8:
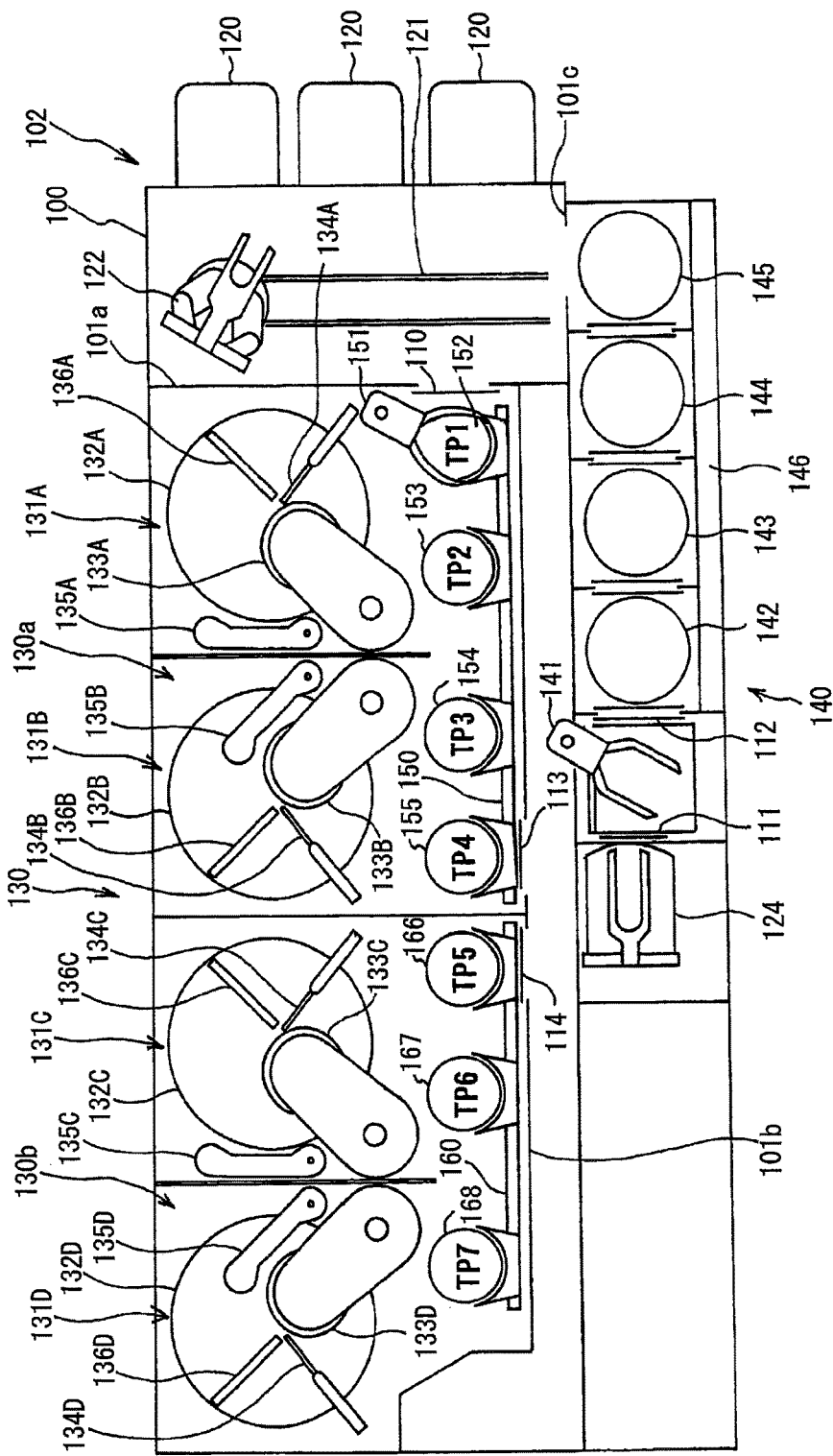
FIG. 8 is a view of a polishing apparatus having the substrate cleaning apparatus.

FIG. 8 is a view showing a polishing apparatus provided with the substrate cleaning apparatus discussed above. As shown in FIG. 8, the polishing apparatus has a housing 100 in a substantially rectangular form. An interior space of the housing 100 is divided into a loading and unloading section 102, a polishing section 130, and a cleaning section 140 by partition walls 101a, 101b, 101c.

The loading and unloading section 102 has two or more front loaders 120 (e.g., three front loaders in FIG. 8) on which wafer cassettes, each storing a plurality of wafers therein, are placed. Each of the front loaders 120 can receive thereon an open cassette, an SMIF (Standard Manufacturing Interface) pod, or a FOUP (Front Opening Unified Pod). The SMIF and FOUP are a hermetically sealed container which houses a wafer cassette therein and is covered with a partition wall to provide an interior environment isolated from an external space.

A moving mechanism 121, extending along an arrangement direction of the front loaders 120, is provided in the loading and unloading section 102. A first transfer robot 122 is provided on the moving mechanism 121. This first transfer robot 122 is movable along the direction in which the front loaders 120 are arranged. The first transfer robot 122 can reach the wafer cassettes placed on the front loaders 120 by moving on the moving mechanism 121. The first transfer robot 122 has two hands (i.e., an upper hand and a lower hand) and can use the two hands differently, for example, by using the upper hand when returning a polished wafer to the wafer cassette and using the lower hand when transferring an unpolished wafer.

The polishing section 130 is an area where a wafer is polished. The polishing section 130 includes a first polishing section 130a having a first polishing unit 131A and a second polishing unit 131B therein, and a second polishing section 130b having a third polishing unit 131C and a fourth polishing unit 131D therein. The first polishing unit 131A, the second polishing unit 131B, the third polishing unit 131C, and the fourth polishing unit 131D are arranged along the longitudinal direction of the polishing apparatus, as shown in FIG. 8.

The first polishing unit 131A includes a polishing table 132A holding a polishing pad thereon, a top ring 133A for holding a wafer and pressing the wafer against a polishing surface of the polishing pad on the polishing table 132A, a polishing liquid supply nozzle 134A for supplying a polishing liquid (e.g., a slurry) or a dressing liquid (e.g., pure water) onto the polishing surface of the polishing pad, a dresser 135A for dressing the polishing pad, and an atomizer 136A having nozzles for ejecting a mixture of a liquid (e.g., pure water) and a gas (e.g., nitrogen) in an atomized state to the polishing surface.

Similarly, the second polishing unit 131B includes a polishing table 132B, a top ring 133B, a polishing liquid supply nozzle 134B, a dresser 135B, and an atomizer 136B. The third polishing unit 131C includes a polishing table 132C, a top ring 133C, a polishing liquid supply nozzle 134C, a dresser 135C, and an atomizer 136C. The fourth polishing unit 131D includes a polishing table 132D, a top ring 133D, a polishing liquid supply nozzle 134D, a dresser 135D, and an atomizer 136D.

Figure 9:
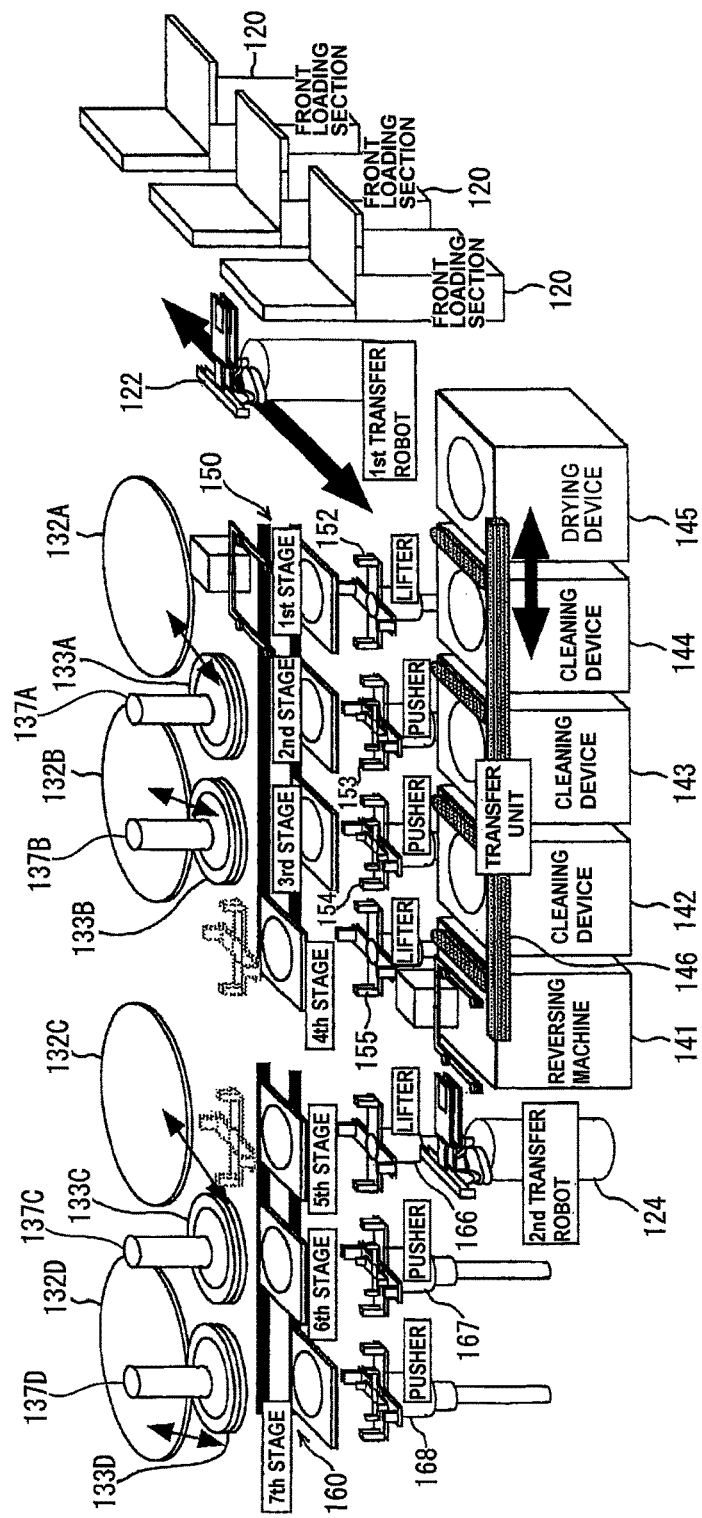
FIG. 9 is a perspective view schematically showing the polishing apparatus shown in FIG. 8.

The polishing pad (not shown) is mounted on the polishing table 132A. The polishing table 132A is coupled to a motor (not shown) disposed below the polishing table 132A. Thus, the polishing table 132A is rotatable about its axis. As shown in FIG. 9, the top ring 133A is coupled via a top ring shaft 137A to a motor and a lifting cylinder (not shown). Thus, the top ring 133A is vertically movable and rotatable about the top ring shaft 137A. The wafer is held on the lower surface of the top ring by, e.g., vacuum suction. An upper surface of the polishing pad constitutes a polishing surface for polishing the wafer.

The top ring 133A, which holds the wafer on its lower surface and rotates the wafer, presses the wafer against the polishing pad on the rotating polishing table 132A. A polishing liquid is supplied onto the polishing surface (upper surface) of the polishing pad from the polishing liquid supply nozzle 134A. Thus, the wafer is polished in the presence of the polishing liquid between the wafer and the polishing pad. The polishing table 132A and the top ring 133A constitute a mechanism for moving the wafer and the polishing surface relative to each other. Each of the second polishing unit 131B, the third polishing unit 131C, and the fourth polishing unit 131D has the same construction as the first polishing unit 131A, and therefore the descriptions thereof are omitted.

A first linear transporter 150 is provided in the first polishing section 130a. This first linear transporter 150 is configured to transfer a wafer between four transferring positions located along the longitudinal direction of the polishing apparatus, i.e., a first transferring position TP1, a second transferring position TP2, a third transferring position TP3, and a fourth transferring position TP4. A reversing machine 151 for reversing a wafer transferred from the first transfer robot 122 is disposed above the first transferring position TP1 of the first linear transporter 150. A vertically movable lifter 152 is disposed below the first transferring position TP1. A vertically movable pusher 153 is disposed below the second transferring position TP2, a vertically movable pusher 154 is disposed below the third transferring position TP3, and a vertically movable lifter 155 is disposed below the fourth transferring position TP4.

In the second polishing section 130b, a second linear transporter 160 is provided next to the first linear transporter 150. This second linear transporter 160 is configured to transfer a wafer between three transferring positions located along the longitudinal direction of the polishing apparatus, i.e., a fifth transferring position TP5, a sixth transferring position TP6, and a seventh transferring position TP7. A vertically movable lifter 166 is disposed below the fifth transferring position TP5 of the second linear transporter 160, a pusher 167 is disposed below the sixth transferring position TP6, and a pusher 168 is disposed below the seventh transferring position TP7, respectively.

As shown in FIG. 9, the first linear transporter 150 has four transfer stages: a first stage, a second stage, a third stage, and a fourth stage, which are linearly movable in a reciprocating manner. These stages have a two-line structure including an upper line and a lower line. Specifically, the first stage, the second stage and the third stage are disposed on the lower line, and the fourth stage is disposed on the upper line.

The lower and upper stages can freely move without interfering with each other, because they are provided at different heights. The first stage transfers a wafer between the first transferring position TP1, and the second transferring position TP2, which is a wafer receiving/delivering position. The second stage transfers a wafer between the second transferring position TP2 and the third transferring position TP3, which is a wafer receiving/delivering position. The third stage transfers a wafer between the third transferring position TP3 and the fourth transferring position TP4.

The fourth stage transfers wafer between the first transferring position TP1 and the fourth transferring position TP4.

The second linear transporter 160 has substantially the same structure as the first linear transporter 150. Specifically, the fifth stage and the sixth stage are disposed on an upper line, whereas the seventh stage is disposed on a lower line. The fifth stage transfers a wafer between the fifth transferring position TP5 and the sixth transferring position TP6, which is a wafer receiving/delivering position. The sixth stage transfers a wafer between the sixth transferring position TP6 and the seventh transferring position TP7, which is a wafer receiving/delivering position. The seventh stage transfers a wafer between the fifth transferring position TP5 and the seventh transferring position TP7.

The cleaning section 140 is an area where a polished wafer is cleaned and dried. The cleaning section 140 includes a second transfer robot 124, a reversing machine 141 for reversing a wafer transferred from the second transfer robot 124, three cleaning units 142-144 each for cleaning a polished wafer, a drying unit 145 for drying the cleaned wafer, and a transfer unit 146 for transferring a wafer between the reversing machine 141, the cleaning units 142-144, and the drying unit 145.

The transfer unit 146 has a plurality of arms for gripping the wafers. The wafers gripped by the arms of the transfer unit 146 are transferred between the reversing machine 141, the cleaning units 142-144, and the drying unit 145 simultaneously in a horizontal direction. The cleaning unit 142 and the cleaning unit 143 may be, for example, a roll type cleaning unit which rotates and presses upper and lower roll-shaped sponges against front and rear surfaces of a wafer to clean the front and rear surfaces of the wafer. The cleaning unit 144 is the substrate cleaning apparatus according to the above-described embodiment shown in FIG. 1 or FIG. 4. The drying unit 145 is a spin drying machine for drying the cleaned wafer by rotating the cleaned wafer at high speed.

A shutter 110 is provided between the reversing machine 151 and the first transfer robot 122. When transferring a wafer, the shutter 110 is opened, and the wafer is delivered between the first transfer robot 122 and the reversing machine 151. Shutters 111, 112, 113, and 114 are disposed between the reversing machine 141 and the second transfer robot 124, between the reversing machine 141 and the primary cleaning unit 142, between the first polishing section 130a and the second transfer robot 124, and between the second polishing section 130b and the second transfer robot 124, respectively. For transferring wafers, the shutters 111, 112, 113, and 114 are opened, and a wafer is delivered.

The polishing apparatus shown in FIG. 8 can perform a series of processes including polishing, cleaning, and drying of the wafer.

The previous description of embodiments is provided to enable a person skilled in the art to make and use the present invention. Moreover, various modifications to these embodiments will be readily apparent to those skilled in the art, and the generic principles and specific examples defined herein may be applied to other embodiments. Therefore, the present invention is not intended to be limited to the embodiments described herein but is to be accorded the widest scope as defined by limitation of the claims.

What is claimed is:

1. A substrate cleaning apparatus, comprising:
a cleaning vessel for housing a substrate therein;
a substrate holder arranged in the cleaning vessel;
a chemical liquid nozzle for supplying a chemical liquid onto the substrate held by the substrate holder;

a plurality of cleaning liquid nozzles for supplying a cleaning liquid toward a hydrophilic inner surface of the cleaning vessel, the hydrophilic inner surface surrounding the substrate holder, each one of the plurality of cleaning liquid nozzles being oriented outwardly in a non-vertical direction away from the substrate holder and toward the hydrophilic inner surface; and an oscillation mechanism for causing the plurality of cleaning liquid nozzles to oscillate, wherein the plurality of cleaning liquid nozzles are arranged so as to form a film of the cleaning liquid on the hydrophilic inner surface such that the film surrounds an entire circumference of the substrate holder while the chemical liquid nozzle supplies the chemical liquid onto the substrate held by the substrate holder, the hydrophilic inner surface comprises a front surface, a back surface, and two side surfaces, and the plurality of cleaning liquid nozzles includes a first nozzle oriented toward the front surface, a second nozzle oriented toward the back surface, a third nozzle oriented toward one of the two side surfaces, and a fourth nozzle oriented toward other of the two side surfaces.

2. The substrate cleaning apparatus according to claim 1, wherein the plurality of cleaning liquid nozzles are arranged along an entirety of the hydrophilic inner surface.

3. The substrate cleaning apparatus according to claim 1, wherein the plurality of cleaning liquid nozzles are located above the substrate holder.

4. The substrate cleaning apparatus according to claim 1, wherein the hydrophilic inner surface comprises a surface with a hydrophilic material coating.

5. A polishing apparatus, comprising:
a polishing section for polishing a substrate; and
the substrate cleaning apparatus according to claim 1 for cleaning the polished substrate.

6. The substrate cleaning apparatus according to claim 1, wherein the cleaning vessel is formed of polyvinyl chloride.

7. The substrate cleaning apparatus according to claim 1, wherein the oscillation mechanism includes a linkage coupled to the plurality of cleaning liquid nozzles and an actuator configured to drive the linkage.

8. The substrate cleaning apparatus according to claim 1, wherein the plurality of cleaning liquid nozzles is arranged so as to surround an entire circumference of the substrate holder.

9. The substrate cleaning apparatus according to claim 1, wherein the oscillation mechanism is configured to rotate each cleaning liquid nozzle about an associated axis.

10. The substrate cleaning apparatus according to claim 9, wherein the associated axis of each cleaning liquid nozzle is vertical.

11. The substrate cleaning apparatus according to claim 9, wherein the oscillation mechanism is configured to rotate the plurality of cleaning liquid nozzles in synchronization with each other.

12. The substrate cleaning apparatus according to claim 9, wherein the oscillation mechanism includes a plurality of linkages that are coupled to the plurality of cleaning liquid nozzles such that oscillation of the plurality of linkages causes the plurality of cleaning liquid nozzles to oscillate.

13. The substrate cleaning apparatus according to claim 12, wherein the oscillation mechanism further includes a motor having a shaft that rotates to oscillate the plurality of linkages and plurality of cleaning liquid nozzles.

14. The substrate cleaning apparatus according to claim 12, wherein the oscillation mechanism further includes a cylinder having a piston rod that reciprocates to oscillate the plurality of linkages and plurality of cleaning liquid nozzles.

15. The substrate cleaning apparatus according to claim 1, wherein the chemical liquid nozzle is configured to supply the chemical liquid having an etching action on the substrate.

16. The substrate cleaning apparatus according to claim 1, wherein the chemical liquid ranges from an ordinary temperature to 100° C.

17. The substrate cleaning apparatus according to claim 1, wherein the hydrophilic inner surface comprises a roughened surface, a surface with hydrophilic material coating, a surface that has been subjected to a plasma surface modification, or a combination thereof.

18. The substrate cleaning apparatus according to claim 1, wherein the cleaning vessel has an opening through which the substrate is carried into and out of the cleaning vessel, and further has a shutter configured to close the opening.

19. The substrate cleaning apparatus according to claim 1, further comprising a connection pipe extending horizontally along an entirety of the hydrophilic inner surface, the connection pipe being located in the cleaning vessel, the plurality of cleaning liquid nozzles being coupled to the connection pipe.

20. A polishing apparatus comprising:
a polishing section for polishing a substrate; and
a cleaning section for cleaning the polished substrate;
wherein the cleaning section has:
a first substrate cleaning apparatus for cleaning the polished substrate, the first substrate cleaning apparatus having a upper roll-shaped sponge and a lower roll-shaped sponge, the upper roll-shaped sponge and the lower roll-shaped sponges are configured to rotate and press against front and rear surfaces of the substrate, respectively, to clean the front and rear surfaces of the substrate;
a second substrate cleaning apparatus having the substrate cleaning apparatus according to claim 1, for cleaning the substrate cleaned by the first substrate cleaning apparatus; and
a drying apparatus for drying the substrate cleaned by the second substrate cleaning apparatus.

* * * * *